United States Patent
Yu et al.

(10) Patent No.: US 9,024,368 B1
(45) Date of Patent: May 5, 2015

(54) FIN-TYPE TRANSISTOR STRUCTURES WITH EXTENDED EMBEDDED STRESS ELEMENTS AND FABRICATION METHODS

(71) Applicant: GLOBALFOUNDRIES Inc., Grand Cayman (KY)

(72) Inventors: Hong Yu, Rexford, NY (US); Hyucksoo Yang, Watervliet, NY (US); Bingwu Liu, Ballston Spa, NY (US); Puneet Khanna, Clifton Park, NY (US); Lun Zhao, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/079,757

(22) Filed: Nov. 14, 2013

(51) Int. Cl.
| | |
|---|---|
| *H01L 29/76* | (2006.01) |
| *H01L 21/336* | (2006.01) |
| *H01L 29/78* | (2006.01) |
| *H01L 29/66* | (2006.01) |
| *H01L 29/08* | (2006.01) |

(52) U.S. Cl.
CPC ...... *H01L 29/7848* (2013.01); *H01L 29/66795* (2013.01); *H01L 29/0847* (2013.01)

(58) Field of Classification Search
CPC .............. H01L 21/823412; H01L 21/823414; H01L 29/785; H01L 29/7848; H01L 29/78696; H01L 29/42392; H01L 29/42383; H01L 29/66795; H01L 29/0847
USPC .......... 257/401, 288, 247; 438/142, 197, 283, 438/701
See application file for complete search history.

(56) References Cited

U.S. PATENT DOCUMENTS

| | | | |
|---|---|---|---|
| 7,358,551 B2 * | 4/2008 | Chidambarrao et al. ...... | 257/288 |
| 8,253,204 B2 * | 8/2012 | Lee et al. ...................... | 257/368 |
| 8,334,185 B2 | 12/2012 | Kronholz et al. | |
| 8,497,180 B2 * | 7/2013 | Javorka et al. ................ | 438/305 |
| 8,674,433 B2 * | 3/2014 | Liao et al. ...................... | 257/327 |
| 8,722,498 B2 * | 5/2014 | Scheiper et al. .............. | 438/289 |
| 2012/0161238 A1 * | 6/2012 | Scheiper et al. .............. | 257/368 |
| 2013/0052778 A1 * | 2/2013 | Liao et al. ..................... | 438/197 |

* cited by examiner

*Primary Examiner* — Nikolay Yushin
(74) *Attorney, Agent, or Firm* — Naresh K. Kannan, Esq.; Heslin Rothenberg Farley & Mesiti P.C.

(57) ABSTRACT

Fin-type transistor fabrication methods and structures are provided having extended embedded stress elements. The methods include, for example: providing a gate structure extending over a fin extending above a substrate; using isotropic etching and anisotropic etching to form an extended cavity within the fin, where the extended cavity in part undercuts the gate structure, and where the using of the isotropic etching and the anisotropic etching deepens the extended cavity into the fin below the undercut gate structure; and forming an embedded stress element at least partially within the extended cavity, including below the gate structure.

18 Claims, 7 Drawing Sheets

FIN-TYPE TRANSISTOR STRUCTURES WITH EXTENDED EMBEDDED STRESS ELEMENTS AND FABRICATION METHODS

FIELD OF THE INVENTION

The present invention relates to structures and methods for facilitating fabricating fin-type transistors, and more particularly to fin-type transistor structures with embedded stress elements and methods of facilitating fabrication thereof.

BACKGROUND OF THE INVENTION

Fin field-effect transistor (FinFET) devices are currently being developed to replace conventional planar metal oxide semiconductor field-effect transistors (MOSFETs) in advanced complementary metal oxide semiconductor (CMOS) technology due to their improved short-channel effect immunity and higher on-current to off-current ratio ($I_{on}/I_{off}$). As is known, the term "fin" refers to a vertical structure within or upon which are formed, for instance, one or more FinFETs or other fin devices, including capacitors, diodes, etc.

Enhancements in fin device structures and fabrication methods continue to be pursued for enhanced performance and commercial advantage.

BRIEF SUMMARY

The shortcomings of the prior art are overcome, and additional advantages are provided through the provision, in one aspect, of a method for facilitating fabricating a fin-type transistor. The facilitating fabricating includes: providing a gate structure extending at least partially over a fin extending above a substrate; using isotropic etching and anisotropic etching to form an extended cavity within the fin, where the extended cavity in part undercuts the gate structure, and where the isotropic etching and the anisotropic etching are used to deepen the extended cavity into the fin below the undercut gate structure; and forming an embedded stress element at least partially within the extended cavity, including below the gate structure.

In a further aspect, a structure is provided which includes a fin-type transistor, the fin-type transistor including: a gate structure extending at least partially over a fin extending above a substrate; an extended cavity within the fin, where the extended cavity in part undercuts the gate structure, and extends into the fin below the undercut gate structure; and an embedded stress element disposed at least partially within the extended cavity, including below the gate structure, the embedded stress element including one of a drain or a source of the fin-type transistor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
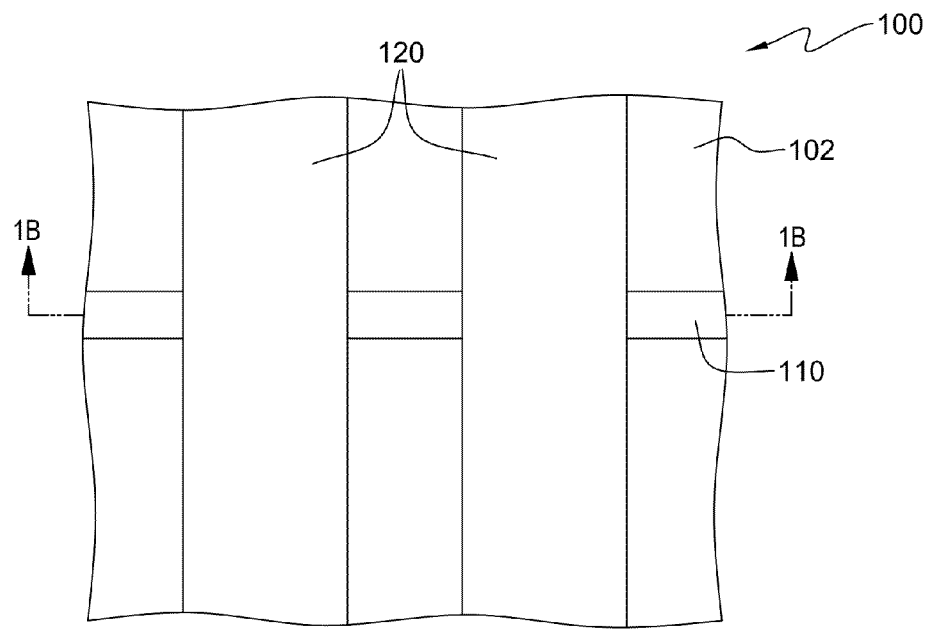
FIG. 1A depicts a plan view of one embodiment of a structure obtained during a fin-type transistor fabrication process, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts, will be apparent to those skilled in the art from this disclosure.

The present disclosure provides, in part, fin-type transistor structures with source and drain elements which include or are formed as extended embedded stress elements, and fabrication methods thereof, which advantageously improve circuit performance by increasing the mobility of charge carriers within, for example, the channel of a fin field-effect transistor (FinFET) device. Embedded stress elements, applying compressive stress to the channel of a p-type FET (PFET) or tensile stress to the channel of an n-type FET (NFET), increase the mobility of holes or electrons, respectively, thereby increasing the speed and performance of the FinFETs.

Formation of one or more embedded stress elements may be achieved by forming one or more cavities within a fin, followed by forming the embedded stress element(s) within the cavities. Due to the small critical dimensions of today's fins, for instance, with a width in a 1 to 10 nanometer range, formation of such cavities may be challenging to achieve, while still maintaining the integrity of other device features located close to the channel, such as, for example, extension regions. Furthermore, because FinFETs are three-dimensional, typically with a gate wrapping around the channel, conventional techniques for applying stress to two-dimensional MOSFET channels, when applied to FinFETs, may not achieve desired circuit performance characteristics.

Generally stated therefore, provided herein, in one aspect, is a method for facilitating fabricating a fin-type transistor. The facilitating fabricating includes: providing a gate structure extending at least partially over a fin extending above a substrate; using isotropic etching and anisotropic etching to form an extended cavity within the fin, where the extended cavity in part undercuts the gate structure, and where the using of the isotropic etching and the anisotropic etching deepens the extended cavity into the fin below the undercut gate structure; and forming an embedded stress element at least partially within the extended cavity, including below the gate structure. In a specific embodiment, the embedded stress element may include or be one of a drain or a source of the fin-type transistor. In another example, the gate structure could include a spacer layer, and the undercutting may include undercutting the spacer layer. In one example, a thickness of the spacer layer of the gate structure may laterally limit the extended cavity below the gate structure by blocking a portion of the isotropic etching from reaching below the gate structure.

In an enhanced embodiment, using isotropic etching and anisotropic etching may include sequentially using the isotropic etching and the anisotropic etching. In one example, the sequentially using isotropic etching and anisotropic etching may include: isotropically etching an exposed upper surface of the fin to form an initial cavity at least partially undercutting the gate structure; and anisotropically etching the exposed surface of the fin within the initial cavity to extend the initial cavity further downward into the fin by, in part, further removing material below the gate structure, thereby forming the extended cavity. In another example, sequentially using isotropic etching and anisotropic etching may include: anisotropically etching an exposed upper surface of the fin to form an initial cavity extending downward into the fin; and subsequently isotropically etching an exposed vertical surface of the fin within the initial cavity to, in part, remove material below the gate structure to undercut the gate structure, and thereby form the extended cavity below the undercut gate structure.

In another aspect, the fin could be formed with an active layer above an isolation layer, and the extended cavity, where undercutting the gate structure, could extend into the fin for a majority of a thickness of the active layer.

In a further example, the isotropic etching could include etching along a {111} plane extending at an angle laterally into the fin below the gate structure to facilitate defining a portion of the extended cavity. In another example, the anisotropic etching could include etching along a {110} plane extending downward into the fin below the gate structure to facilitate defining a portion of the extended cavity. In one specific example, forming the embedded stress element could include epitaxially growing a material from at least one surface of the fin within the extended cavity to form the embedded stress element, where the embedded stress element is configured and formed to apply a stress on a channel portion of the fin below the gate structure.

In an enhanced embodiment, using isotropic etching and anisotropic etching may further include forming a second extended cavity within the fin, where the second extended cavity in part undercuts a second side of the gate structure opposite from the first extended cavity, and using of isotropic etching and anisotropic etching deepens the second extended cavity into the fin below the undercut second side of the gate structure, and the method further includes forming a second embedded stress element at least partially within the second extended cavity, including below the gate structure. In such a case, a region of the fin located between the first extended cavity and the second extended cavity may include or be a channel of the fin-type transistor, with the (first) embedded stress element being a source of the fin-type transistor, and the second embedded stress element being a drain of the fin-type transistor.

In another aspect, a structure is provided which includes a fin-type transistor. The fin-type transistor includes: a gate structure extending at least partially over a fin extending above a substrate; an extended cavity within the fin, where the extended cavity in part undercuts the gate structure, and extends into the fin below the undercut gate structure; and an embedded stress element at least partially within the extended cavity, including below the gate structure, the embedded stress element including or being one of a drain or a source of the fin-type transistor. In such a case, the fin may include an active layer above an isolation layer, and the embedded stress element where undercutting the gate structure may extend into the fin for a majority of a thickness of the active layer. In one example, the fin may be partially defined by a {111} plane extending at an angle laterally below the gate structure. In another example, the fin may be partially defined by a {110} plane extending downward below the gate structure. In an alternate embodiment, the fin may at least partially include a first tip, the first tip being an intersection of the {110} plane and a first {111} plane of the fin; and a second tip, the second tip being an intersection of the {110} plane and a second {111} plane of the fin, where the second tip resides within the fin below the first tip.

In another embodiment, the structure may further include: a second extended cavity within the fin, where the second extended cavity in part undercuts a second side of the gate structure opposite a first side undercut by the extended cavity (that is, the first extended cavity), the first side of the gate structure being opposite the second side of the gate structure, and the second cavity extends into the fin below the undercut second side of the gate structure; a second embedded stress element disposed at least partially within the second extended cavity, including below the gate structure, the second embedded stress element including or being a source or drain of the fin-type transistor; and a channel of the fin-type transistor located in a region of the fin between the first extended cavity and the second extended cavity.

Reference is made below to the drawings, which are not drawn to scale for ease of understanding, wherein the same reference numbers used throughout different figures designate the same or similar components.

Figure 1B:
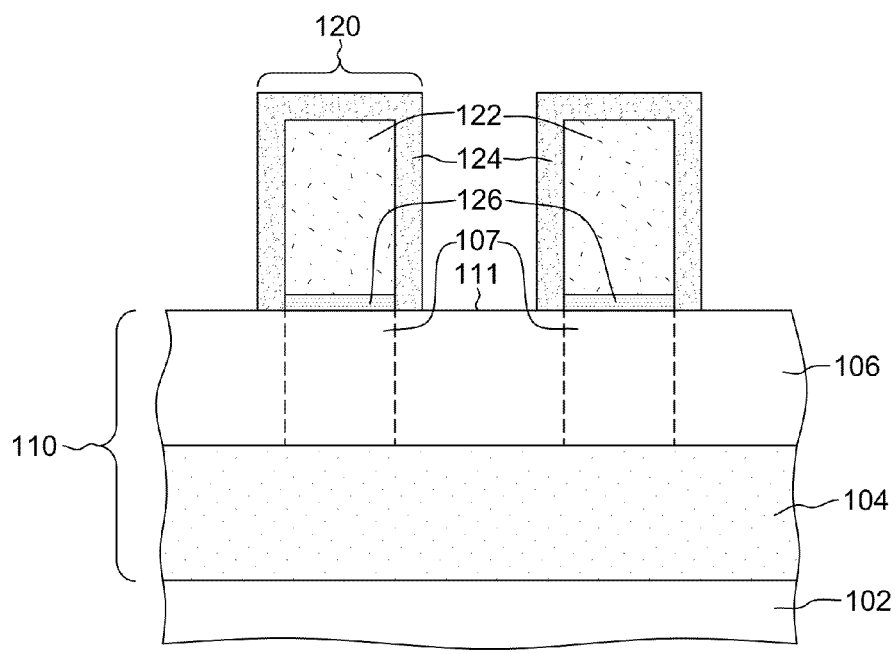
FIG. 1B is a partial cross-sectional elevation view of the structure of FIG. 1A, taken along line 1B-1B thereof, and illustrating a fin with multiple gate structures extending thereover, in accordance with one or more aspects of the present invention.

FIG. 1A illustrates a plan view of one embodiment of a structure 100 obtained during a fin-type transistor fabrication process, in accordance with one or more aspects of the present invention. In the example shown, structure 100 includes a substrate 102, which may be (in one example) a bulk semiconductor material such as a bulk silicon wafer. As another example, substrate 102 may include any silicon-containing substrate including, but not limited to, silicon (Si), single crystal Si, polycrystalline Si, amorphous Si, Si-on-nothing (SON), Si-on-insulator (SOI), or Si-on-replacement insulator (SRI) substrates and the like, and may be n-type or p-type doped. Substrate 102 might be, for instance, approximately 600-700 micrometers thick, as one example only. As depicted in FIGS. 1A & 1B, a fin 110 extends above substrate 102. By way of example, fin 110 may be formed by removing one or more portions of substrate 102, thereby creating one or more fins 110 of the same material as substrate 102, for example a semiconductor or crystalline material. In another example, formation of fin 110 may be achieved by patterning substrate 102 using various schemes, including: direct lithography; sidewall image transfer technique; extreme ultraviolet lithography (EUV); e-beam technique; litho-etch litho-etch; or litho-etch litho-freeze. Following patterning, removal may be performed, for example, by any suitable etching process, such as an anisotropic dry etching process, for instance, reactive-ion-etching (RIE) in sulfur hexafluoride ($SF_6$). Although the following numbers are relative and the heights could vary, as one specific example, fin 110 may have a height of about 40 nanometers, and a length of about one micrometer, several micrometers, or the diameter of the entire wafer, while the thickness of the fin may be approximately 10 nanometers or less.

Continuing with reference to FIG. 1A, multiple gate structures 120 may extend over fin 110, and may overlap fin 110 in selected areas to operate as, for instance, the gates of multiple fin-type transistors, such as one or more fin field-effect transistors (FinFETs) being fabricated in association with fin 110. As used herein, gate structures 120 may generally refer to sacrificial gate structures, such as polycrystalline silicon (polysilicon) sacrificial gates, which are to be removed and replaced with replacement gate structures as part of a gate-last fabrication process, or gate structures 120 may refer generally to final gate structures as part of a gate-first fabrication process. Gate structures 120, which may be conformal structures overlying fin 110, and possibly substrate 102, may be formed using any suitable deposition process, such as atomic layer deposition (ALD), chemical vapor deposition (CVD), physical vapor deposition (PVD) or the like.

FIG. 1B illustrates a partial cross-sectional elevation view of the structure of FIG. 1A, taken along line 1B-1B thereof. In the embodiment depicted, fin 110 includes, for instance, an active layer 106 disposed above an isolation layer 104. Active layer 106 may facilitate defining, for instance, a channel region 107 of a fin-type transistor such as a FinFET. Isolation layer 104 may be a passive layer, or insulator layer, provided (for instance) to prevent leakage of current into substrate 102. By way of example, active layer 106 may be the same material as substrate 102, such as a semiconductor material, while in other examples, active layer 106 and substrate 102 may be different materials, or may be semiconductor materials having different dopants or different dopant concentrations. As a specific example, the thickness of active layer 106 may be between, for instance, 10 nanometers and 60 nanometers.

Various techniques may be used to form isolation layer 104 within fin 110. For instance, one example method may include: providing an intermediate semiconductor structure which includes substrate 102, a sacrificial layer over substrate 102 (which includes an oxidizable material, for instance, silicon germanium), and a semiconductor layer disposed over the sacrificial layer; etching the intermediate semiconductor structure to create fin 110, which includes a portion of the semiconductor layer (forming active layer 106), a portion of the sacrificial layer, and a portion of substrate 102; and selectively oxidizing the sacrificial layer, while maintaining its structural stability, such that the oxidized, sacrificial layer defines isolation layer 104. Another example method may include: providing fin 110 extending above substrate 102, with fin 110 including active layer 106 disposed above or over a sacrificial layer; mechanically stabilizing (by, for example, disposing gate structures 120 over fin 110) active layer 106 of fin 110; removing a portion of the sacrificial layer of fin 110 to create a void below active layer 106 of fin 110; filling the void, at least partially, below active layer 106 with an isolation material to create isolation layer 104 in fin 110. A further exemplary method may include: transforming a portion of fin 110 into isolation layer 104, where isolation layer 104 separates active layer 106 of fin 110 from substrate 102. In such a case, transforming the portion of fin 110 may include oxidizing the portion of fin 110 to form isolation layer 104, and this oxidizing may include: providing an oxidizing material in contact with the portion of fin 110; and annealing the oxidizing material and fin 110 to oxidize the portion of fin 110 and thereby form isolation layer 104 therein.

Isolation layer 104 may include, for example, an oxide, such as silicon dioxide, or a high dielectric constant (high-k) material, and may, depending on the desired circuit design, have a thickness of between 1 and 100 nanometers. Gate structures 120 may include gate metals 122, spacer layers 124, and gate oxides 126, in, for instance, a gate-first process example. Spacer layers 124, which may be, for example, film layers formed along the sidewalls of gate metals 122, may be deposited using conventional deposition processes, such as, for example, CVD, low-pressure CVD, or plasma-assisted CVD (PE-CVD), and may be fabricated of a material such as, for example, silicon nitride. In a specific example, silicon nitride spacer layers 124 may be deposited using process gases such as, for example, dichlorosilane ($SiH_2Cl_2$) and ammonia ($NH_3$) and using known process conditions. In another example, gate structures 120 may be sacrificial gate structures of a gate-last process. As one specific example, gate metal 122, gate oxide 126, and semiconductor active region 106 of fin 110 may together constitute the metal, oxide, and semiconductor of a metal-oxide-semiconductor field effect transistor (MOSFET), such as, for example, a FinFET.

Figure 1C:
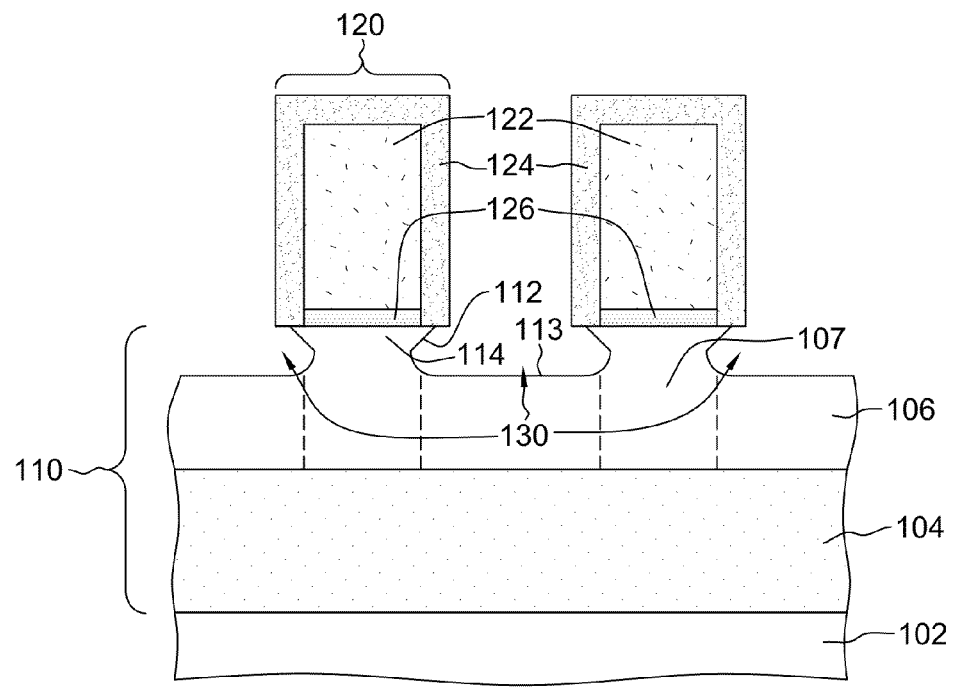
FIG. 1C depicts the structure of FIG. 1B after isotropic etching of an exposed upper surface of the fin to form an initial cavity, in accordance with one or more aspects of the present invention.

FIG. 1C illustrates the structure of FIG. 1B after isotropically etching an exposed upper surface 111 (FIG. 1B) of fin 110 to form initial cavities 130. In the depicted embodiment, this isotropic etching of fin 110 at least partially undercuts gate structures 120. In one example, the process may fully undercut spacer layers 124. Such an undercutting of gate structures 120 occurs because the isotropic etching process is non-directional, and therefore removes material in both a vertical direction, deeper into fin 110, and a lateral direction, into the fin horizontally below gate structures 120. It should be noted that the presence of gate structures 120 may serve to advantageously limit isotropic etching, because, for example, a thickness of spacer layers 124 of gate structures 120 could laterally limit the initial cavities 130 (and thereby, also the resultant extended cavities 132 of FIG. 1D) below gate structure 120 by blocking a portion of the isotropic etching from reaching below gate structure 120, thereby self-limiting the etching distance below gate structure 120 independent of time or other process parameters. A single isotropic etching process step may form several initial cavities 130, for instance, on either side of gate structures 120, and facilitate fabricating numerous source and drain regions for multiple FinFETs.

After isotropic etching, a plane 112 may be revealed, and because of the self-limiting etching process regulated by the thickness of gate structure 120, this plane 112 may be advantageously positioned directly below gate structure 120, rather than (for instance) extending to the edge of gate structure 120. In one embodiment, where for example the upper surfaces of substrate 102 and fin 110 are oriented along a {100} plane, plane 112 may be a {111} plane of fin 110, and initial cavity 130 may extend along this {111} plane into fin 110 below gate structure 120. Note that the symbol {xyz} denotes the Miller index for the set of equivalent crystal planes. In one example, an extension region 114 of fin 110 may be partially defined by plane 112 and may be used to extend the source or drain interface, leading to advantageous performance of the FinFET.

The isotropic etching may be performed by, for example, dry etching such as reactive ion etching (RIE) or plasma etching, using gases highly reactive to the material of active layer 106, such as tetrafluoromethane ($CF_4$), sulfur hexafluoride ($SF_6$), boron chloride, ($BCl_3$), or nitrogentrifluoride ($NF_3$) with process parameters tuned to yield isotropic etching of fin 110. As known, RIE, which uses a reactive plasma material, has features of both chemical etching and physical etching, and therefore process parameters may be tuned to achieve either isotropic RIE. For example, the plasma could be created at a very low, or without any, wafer chuck bias power, such that the incident species have reduced directionality, leading to isotropic etching.

Figure 1D:
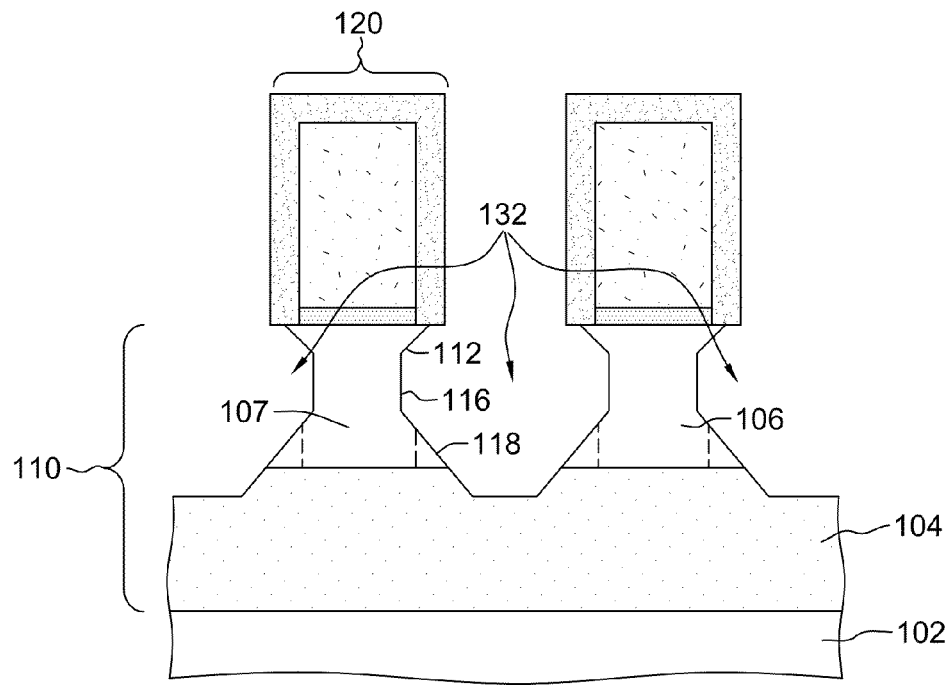
FIG. 1D depicts the structure of FIG. 1C after anisotropic etching of the exposed surface of the fin within the initial cavity to extend the initial cavity further downward into the fin, forming an extended cavity, in accordance with one or more aspects of the present invention.

FIG. 1D illustrates the structure of FIG. 1C after anisotropically etching the exposed surfaces 113 (FIG. 1C) of fin 110 within initial cavities 130 (FIG. 1C). Taken together with FIG. 1C, FIG. 1D depicts one embodiment of a method for using isotropic and anisotropic etching to form extended cavities 132 (FIG. 1D) within fin 110, and specifically illustrates sequentially using isotropic and anisotropic etching to form extended cavities 132. As shown, the anisotropic etching extends the initial cavity 130 (FIG. 1C) further downward into fin 110 thereby forming extended cavity 132. After anisotropic etching, a plane 116 and a plane 118 may be revealed at least partially below the gate structure 120. The extension of the initial cavity 130 (FIG. 1C) in a downward direction takes place because anisotropic etching, such as anisotropic RIE, tends to prefer specific directions, providing higher vertical directionality than lateral directionality rather than removing material equally in all directions. By controlling the process parameters, such as bias and source power, the balance between isotropy and anisotropy can be regulated and in this case, for example, process parameters are chosen to prefer a generally downward etching direction. The prior step of isotropic etching to form initial cavity 130 (FIG. 1C) serves to reveal portions of exposed surface 113 of fin 110 below gate structure 120, thereby allowing, for example, the lateral component of anisotropic RIE to further etch deeper into the fin below the gate structure 120. A single anisotropic etching process step may form several extended cavities 132 on either side of gate structures 120, which may later be filled with embedded stress elements that, for instance, form the sources and drains of the fabricated FinFETs. Anisotropic etching may be achieved using reactant gases along with a carrier gas with a high molecular weight, such as argon, at high source power and high chuck bias power, enhancing the physical component of the RIE and causing the chemical component to become more directional.

After performing anisotropic etching, extended cavities 132 may have, for example, oval sides. Another step of isotropic etching, for example isotropic wet etching, should be performed to further shape or clean extended cavities 132, in order to expose distinct crystal planes of fin 110, allowing for subsequent epitaxial growth from these crystal planes to form embedded stress elements. Isotropic wet etching could be achieved using ammonia hydroxide ($NH_4OH$) as part of, for example, a standard clean 1 (SC-1) process, and may be used because isotropic wet etching may preferentially etch along specific crystal planes of fin 110, thereby defining surfaces with distinct crystallographic orientation.

In one example, where, for instance, substrate 102 is initially oriented with an upper {100} surface, plane 116 may be a {110} plane, and plane 118 may be a {111} plane. For instance, in the embodiment depicted, plane 112 and plane 116 may intersect at a first tip $T_1$, while plane 116 and plane 118 may intersect at a second tip $T_2$, where second tip $T_2$ is below first tip $T_1$. The presence of plane 116 may be advantageous because, for example, in a subsequent processing step to introduce an embedded stress element into extended cavity 132 (as described with reference to FIG. 1F), plane 116, which extends into active layer 104 for a certain thickness of active layer 104, may allow the embedded stress element to exert a stress on fin 110 at plane 116, thereby stressing channel region 107 of fin 110, improving the electrical properties thereof, by, for example, enhancing mobility of charge carriers including holes. As used herein, the term plane refers to a generally planar surface and the term tip refers to an intersection between planes, which may be, for example, a vertex or edge, and planes or tips may be irregular or imperfect due to materials processing conditions. Note that extended cavity 132 may share certain similarities with a so-called sigma cavity, which is named for the resemblance between the Greek-letter $\Sigma$ (sigma) and the profile of its angular planes, because both extended cavity 132 and a sigma cavity may have {111}, {110}, and {100} planes. However, by contrast with the examples described herein, a sigma cavity has only one single tip, and as such may only facilitate the formation of embedded stress elements capable of stressing planar, two-dimensional channel regions.

In another example, using isotropic and anisotropic etching could include etching along plane 116 extending downward into fin 110 below gate structure 120 to define a desired vertical portion of extended cavity 132. In such an example, the etching employed may have different etch rates for different orientations of the crystal lattice of fin 110, and may, for example, prefer to etch along a {110} plane.

Anisotropic etching, such as U-shaped etching, may be performed by, for example, dry etching such as reactive ion etching (RIE), or plasma etching, using tetrafluoromethane ($CF_4$), sulfur hexafluoride ($SF_6$), or boron chloride ($BCl_2$), with process parameters tuned to yield anisotropic etching of fin 110, including very aggressive RIE. Alternately, anisotropic wet etching using, for example, potassium hydroxide (KOH) or tetra-methyl-ammonium hydroxide (TMAH) could be used to form extended cavities 132. After performing anisotropic etching, another step, or series of steps, of etching, including isotropic and anisotropic etching steps, including for example wet etching using TMAH, may be performed to further shape or clean extended cavities 132.

Figure 1E:
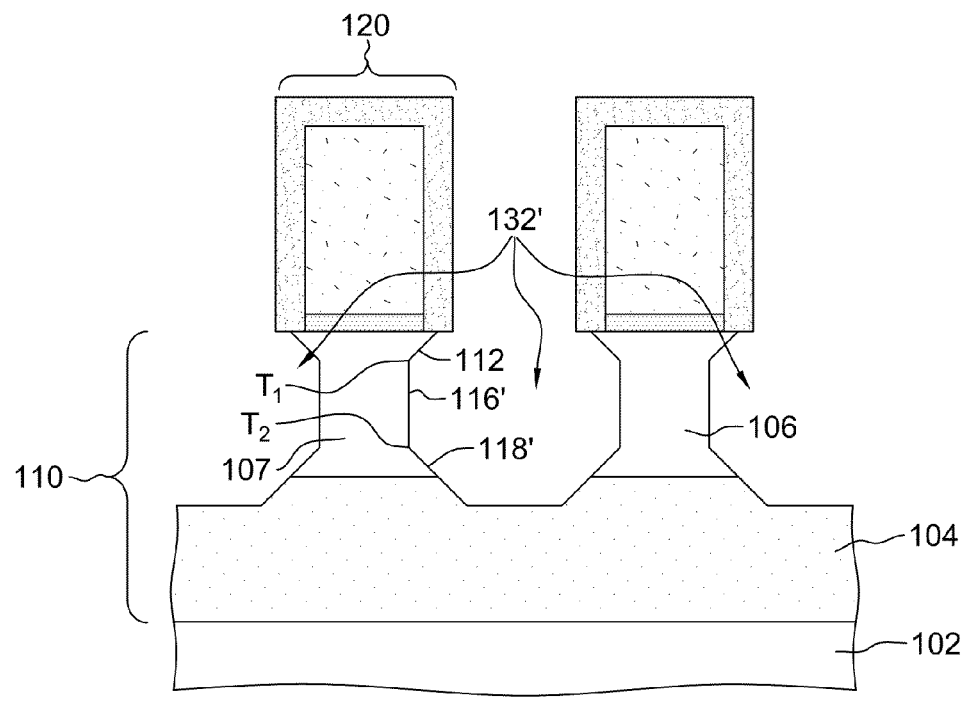
FIG. 1E depicts an alternate embodiment of anisotropic etching of the structure of FIG. 1C, such that the extended cavity where undercutting the gate structure extends into the fin for a majority of a thickness of the active layer of the fin, in accordance with one or more aspects of the present invention.

FIG. 1E illustrates the structure of FIG. 1C, where another embodiment of an anisotropic etching process has been used to form slightly different extended cavities 132'. As depicted, extended cavities 132' extend deeper into the fin below the gate structure than extended cavities 132 (FIG. 1D). Furthermore, in the example depicted, extended cavity 132' extends into the fin for a majority of the thickness of active layer 106 of fin 110, and, by way of example, extended cavity 132' may even extend to or into isolation layer 104 below the gate structure. For example, plane 116' itself may extend into the fin for a majority of the thickness of active layer 106 of fin 110. Because extended cavities 132' are deeper in the region of the undercut than extended cavities 132 (FIG. 1D), a greater volume of material may be deposited into extended cavities 132' (as described with reference to FIG. 1F), potentially leading to the formation of embedded stress elements that exerts a greater stress on channel region 107, thereby potentially enhancing operational properties of the resultant FinFET.

Figure 1F:
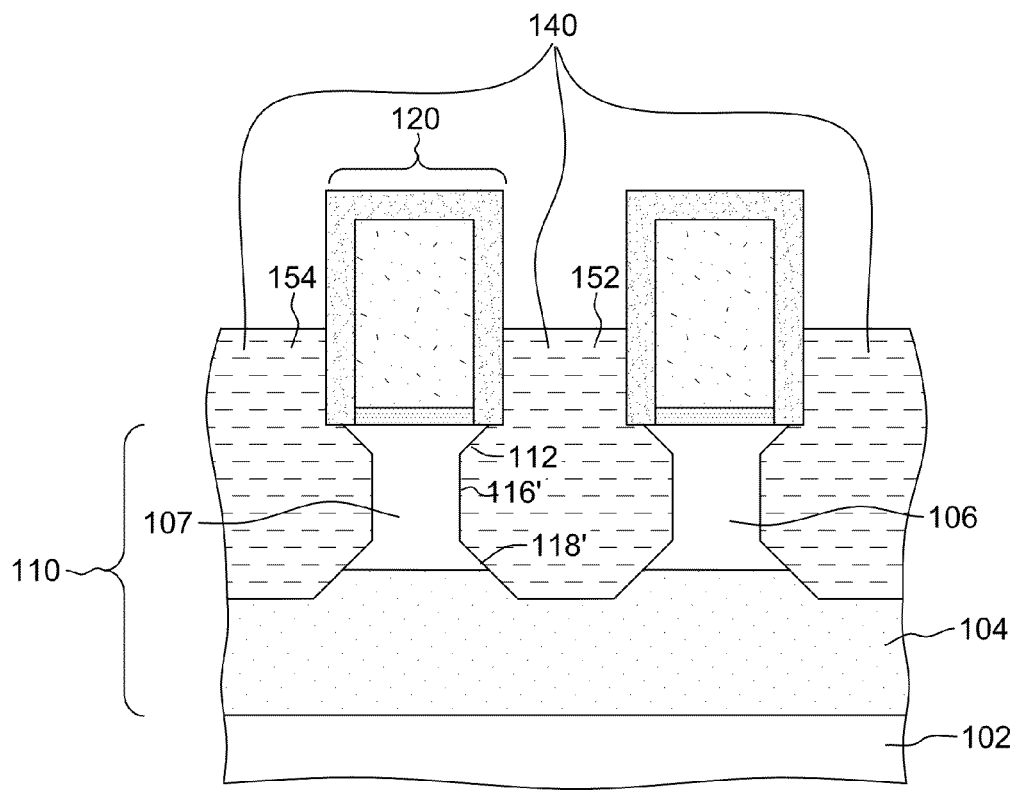
FIG. 1F depicts the structure of FIG. 1E after forming an embedded stress element within the extended cavity, in accordance with one or more aspects of the present invention.

FIG. 1F illustrates the structure of FIG. 1E after forming embedded stress element 140, within extended cavities 132' (FIG. 1E), to define, for example, source 152 and drain 154 regions of a fin-type transistor such as the resultant FinFET. By way of example, embedded stress elements 140 may be formed by epitaxially growing a material from exposed semiconductor surfaces of fin 110. Epitaxial growth refers to the orderly growth of a crystalline material, where the grown material arranges itself in the same crystal orientation as the underlying structure. In one example, epitaxial growth occurs from either one of or a combination of surfaces, including, for example, {111} plane 112, {110} plane 116', and {111} plane 118'. Embedded stress element 140 may be epitaxially grown using selective epitaxial growth via various methods, such as, for example, CVD, low-pressure CVD (LPCVD), or other applicable methods.

The stress applied by embedded stress elements 140 to the channel regions within fin 110 may be tailored to be a compressive stress or a tensile stress, depending on the type of transistor being fabricated. For example, p-type fin transistors, such as PFETs, may have holes as majority charge carriers, and compressive stress may increase the mobility of such charge carriers. On the other hand, n-type fin transistors, such as NFETs, may have electrons as charge carriers, and tensile stress may increase the electron mobility. Embedded stress elements 140 may, for example, apply a stress to the channel region for a majority of the thickness of active layer 106 of fin 110 below the gate structure, thereby increasing the mobility of charge carriers along a majority of a channel of a FinFET. Embedded stress element 140 may include a material having a different lattice constant, or spacing between adjacent atoms, as the material of fin 110. For example, silicon germanium (SiGe), with, e.g., 10-50% germanium doping, may be used to achieve compressive stress, while silicon carbon (SiC) or silicon phosphide (SiP), with, e.g., 0.1-10% doping, may be used to achieve tensile stress. More specifically, fin 110 may include silicon while embedded stress elements 140 may include SiGe. Because SiGe has a greater lattice constant than silicon, epitaxial growth of SiGe within extended cavities 132' (FIG. 1E) may lead to compressive stress exerted on fin 110, which would be desirable to increase the mobility of charge carriers such as holes.

FIGS. 2A-2F illustrate alternate processing embodiments for facilitating fabricating fin-type transistors, and in particular, alternate process embodiments using isotropic etching and anisotropic etching to form extended cavities 232 (FIG. 2E) within a fin 210, in accordance with one or more aspects of the present invention. Referenced structures and features of processes (e.g., etching and deposition processes) may have characteristics which are similar or the same as those previously described for the analogous structures and features of the processes described above with reference to FIGS. 1A-1F.

Figure 2A:
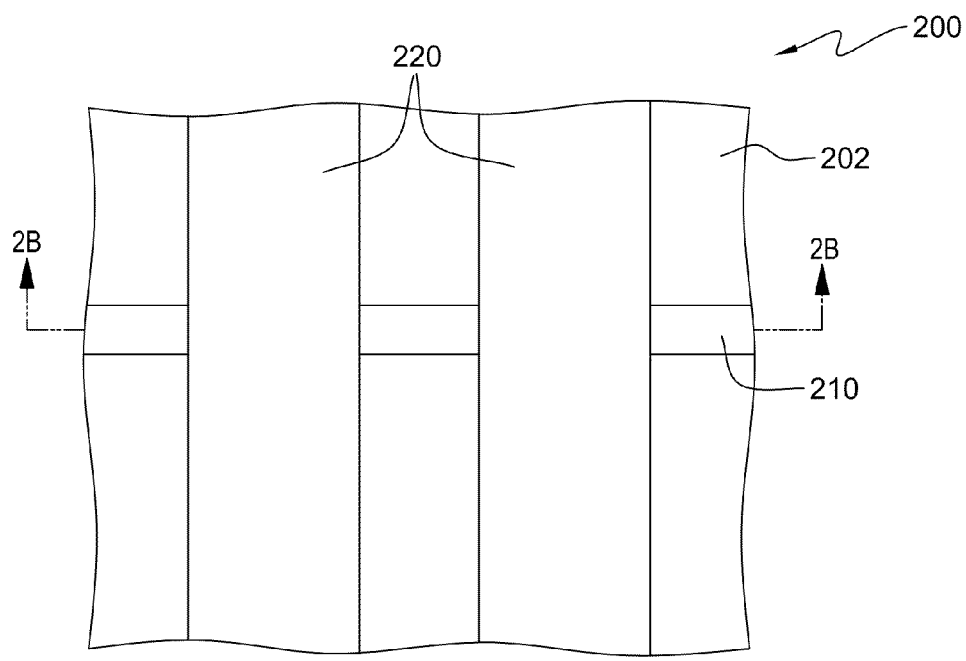
FIG. 2A depicts a plan view of another embodiment of a structure obtained during a fabrication process, which includes multiple gate structures extending over a fin extending above a substrate, in accordance with one or more aspects of the present invention.
Figure 2B:
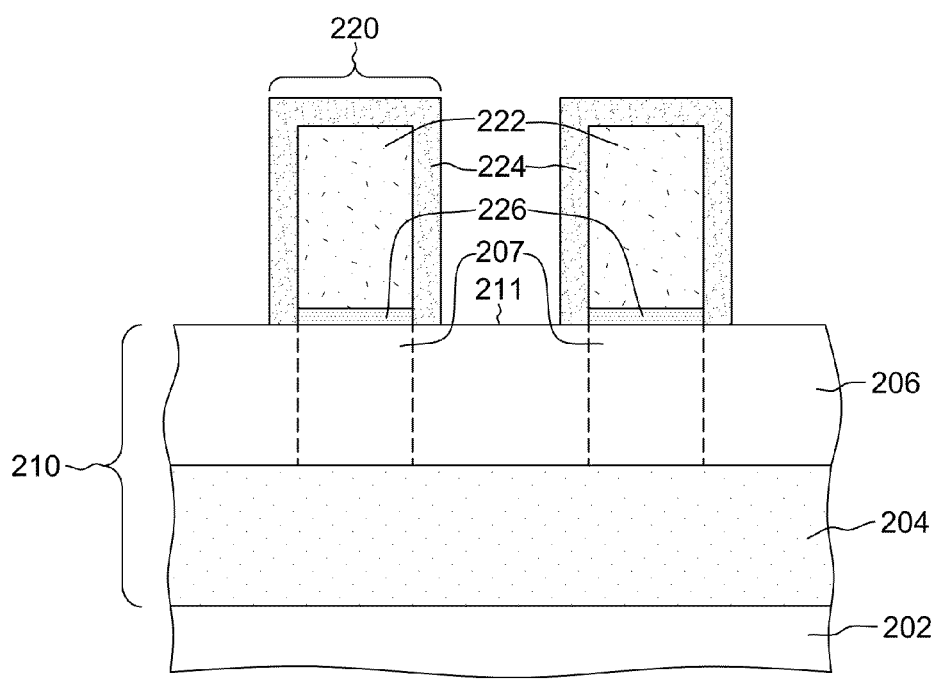
FIG. 2B is a partial cross-sectional elevation view of the structure of FIG. 2A, taken along line 2B-2B thereof, and illustrating the fin with multiple gate structures extending thereover, in accordance with one or more aspects of the present invention.

FIG. 2A illustrates a plan view of another embodiment of a structure 200 obtained during a fabrication process, in accordance with one or more aspects of the present invention. In the example shown, structure 200 includes substrate 202, and as depicted in FIGS. 2A & 2B, a fin 210 extends above substrate 202. Multiple gate structures 220 may extend over fin 210, and be configured to operate as, for instance, gates of multiple fin-type transistors, such as fin field-effect transistor (FinFETs) being fabricated in association with fin 210.

FIG. 2B illustrates a partial cross-sectional elevation view of the structure of FIG. 2A, taken along line 2B-2B thereof. In the embodiment depicted, fin 210 includes, for instance, an active layer 206 disposed above an isolation layer 204. Active layer 206 may facilitate defining, for instance, an isolated channel region 207 of a FinFET, and fin 210 has, in one example, an exposed upper surface 211.

Figure 2C:
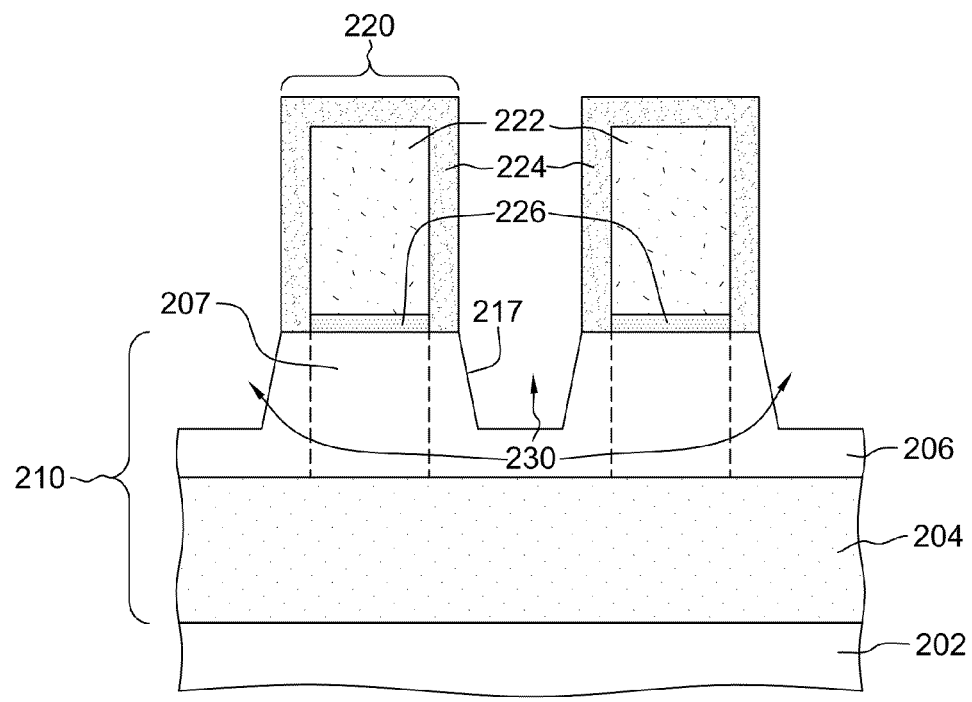
FIG. 2C depicts the structure of FIG. 2B after anisotropic etching of an exposed upper surface of the fin to form an initial cavity extending downward into the fin, in accordance with one or more aspects of the present invention.

FIG. 2C illustrates the structure of FIG. 2B after first anisotropically etching exposed upper surface 211 (FIG. 2B) of fin 210 to form initial cavities 230 extending downward into fin 210. As depicted, anisotropically etching fin 210, unlike isotropic etching (as depicted in FIG. 1C), typically would not undercut the gate structures 220, but rather etches along, for example, side surface 217 of the cavity, to form initial cavity 230 extending into fin 210. A single process step of anisotropic etching may form several initial cavities 230 on either side of gate structures 220, thereby facilitating fabricating, for instance, numerous source and drain regions for multiple FinFETs being formed in association with fin 210.

Figure 2D:
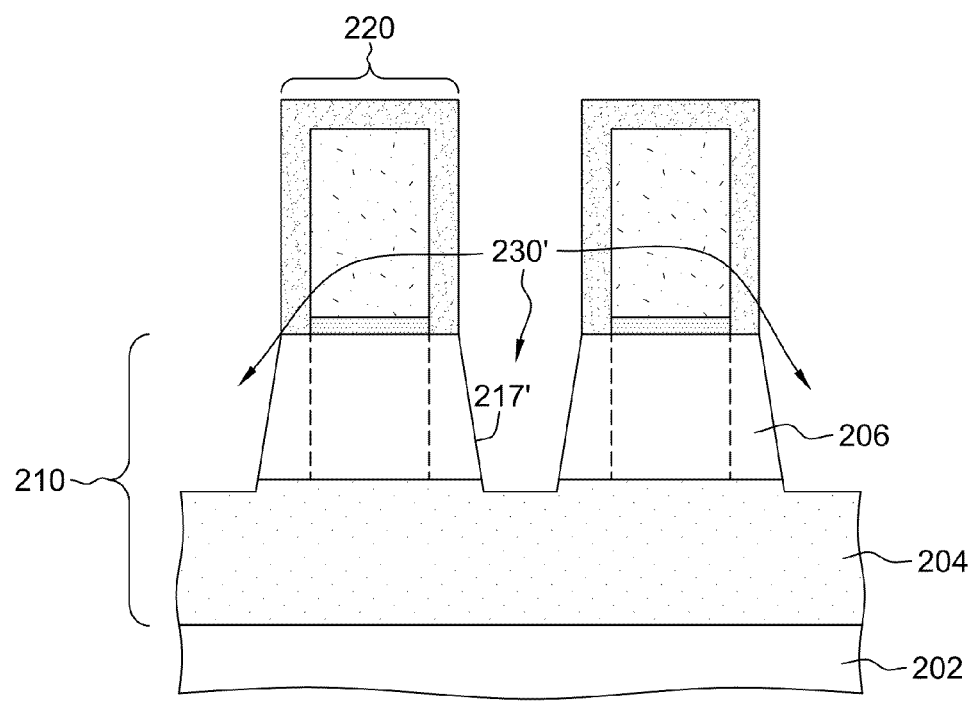
FIG. 2D depicts the structure of FIG. 2B after an alternate embodiment of anisotropic etching of the structure within the fin to provide a deeper initial cavity extending downward into the fin, in accordance with one or more aspects of the present invention.

FIG. 2D illustrates an alternate anisotropic etching of the structure to provide a deeper initial cavity 230' extending downward into fin 210, which may, for example, extend through active layer 206 into isolation layer 204 of fin 210. Initial cavity 230' may, for example, be at least partially defined by a vertically extending surface 217'.

Figure 2E:
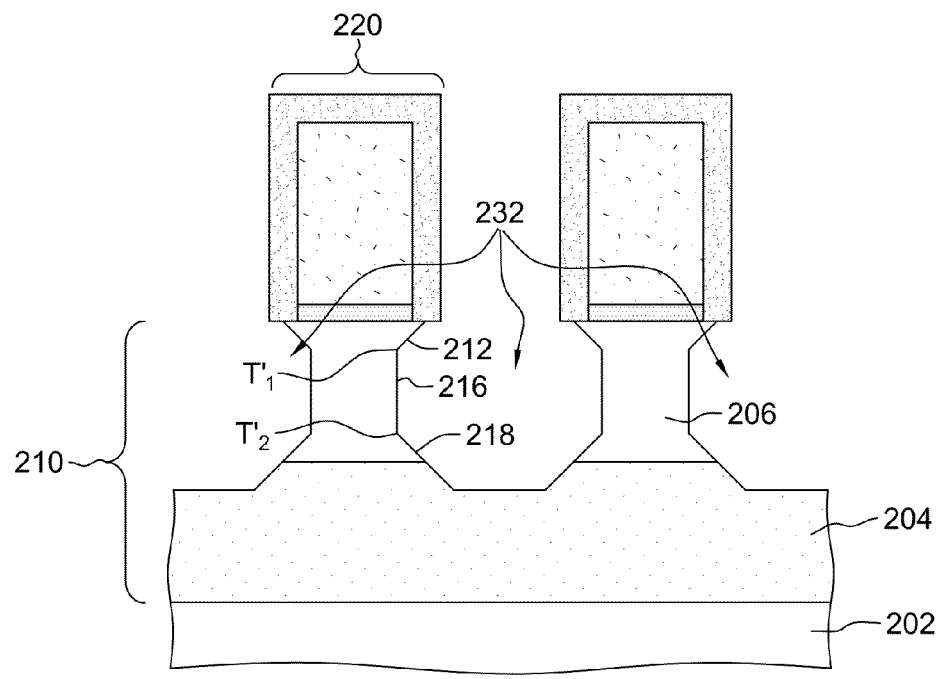
FIG. 2E depicts the structure of FIG. 2D after isotropic etching of exposed surfaces of the fin within the initial cavity to, for instance, remove fin material below the gate structure, to form an extended cavity, in accordance with one or more aspects of the present invention.

FIG. 2E illustrates the structure of FIG. 2D after isotropic etching of the exposed surfaces 217' (FIG. 2D) of fin 210 within initial cavities 230' (FIG. 2D) to, in part, remove material below gate structures 220, undercutting the gate structures 220, and form extended cavities 232. Similar to the self-limiting process described above with reference to FIG. 1C, the presence of gate structure 220 serves to advantageously limit the isotropic etching process. In particular, the width of gate structure 220 functions to limit the undercut of extended cavity 232 below gate structure 220 by blocking a portion of the isotropic etching from reaching below gate structure 220, thereby self-limiting the etching distance laterally below gate structure 220, for instance, independent of time or other process parameters. After the isotropic etching process(es), including, for example, isotropic RIE followed by isotropic wet-etching, a plane 212, a plane 216, and a plane 218 may be revealed. In one example, where, for instance, substrate 202 is initially oriented with an upper {100} surface, plane 212 may be a {111} plane, plane 216 may be a {110} plane, and plane 218 may be a {111} plane. In the embodiment depicted, plane 212 and plane 216 may intersect at a first tip $T'_1$, while plane 216 and plane 218 may intersect at a second tip $T'_2$, where second tip $T'_2$ is below first tip $T'_1$. Taken together, FIGS. 2D & 2E illustrate an alternate fabrication embodiment (as compared to FIGS. 1D & 1E) of a method of sequentially using isotropic and anisotropic etching to form extended cavity 232 within fin 210.

Figure 2F:
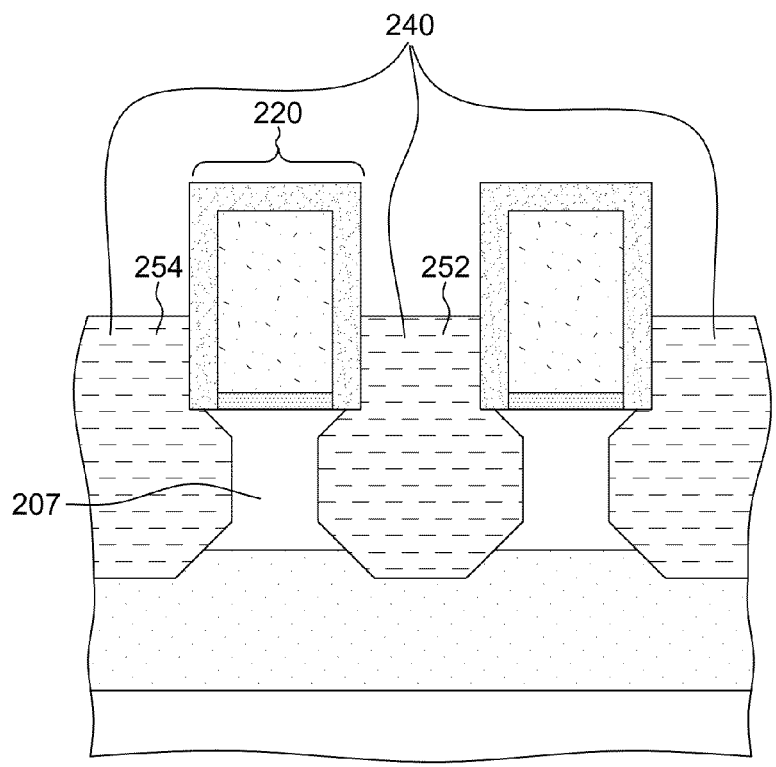
FIG. 2F depicts the structure of FIG. 2E after forming an embedded stress element within the extended cavity, in accordance with one or more aspects of the present invention.

FIG. 2F illustrates the structure of FIG. 2E after forming embedded stress elements 240, within extended cavity 232 (FIG. 2E), to form, for example, source 252 and drain 254 regions of one or more FinFETs. These embedded stress elements 240 may be formed using, for instance, any of the methods described above with respect to FIG. 1F.

Figure 3:
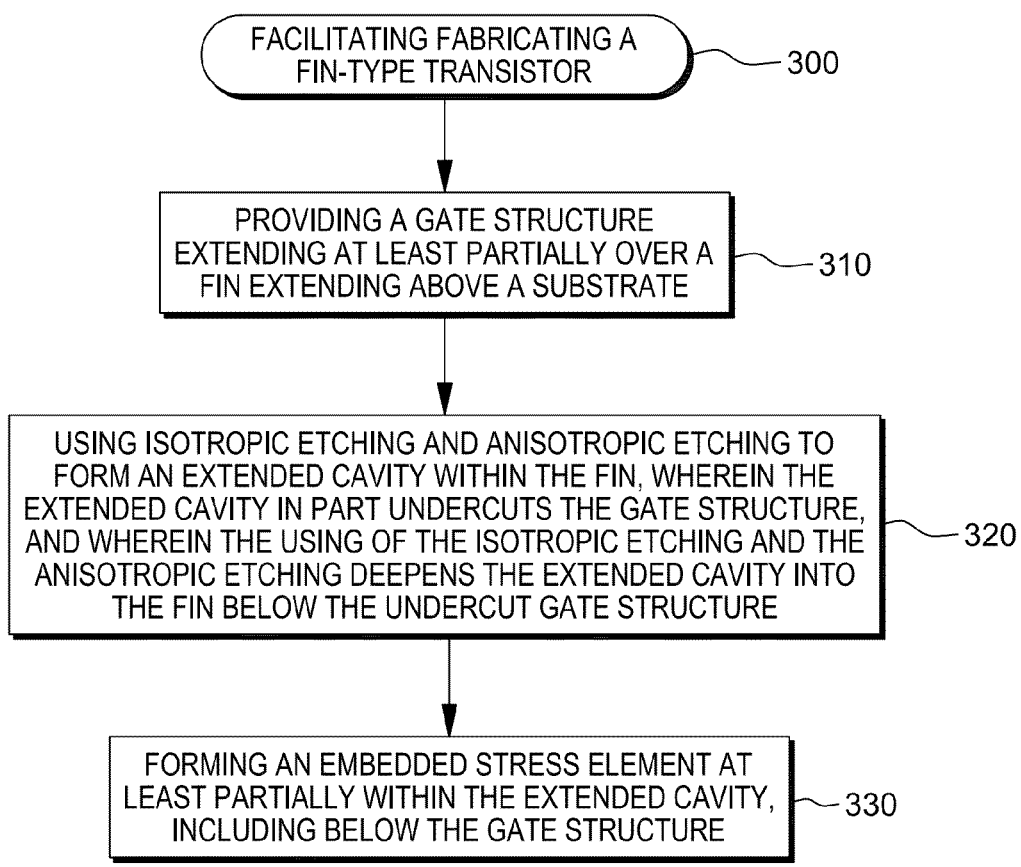
FIG. 3 depicts one embodiment of a process for facilitating fabricating a fin-type transistor, in accordance with one or more aspects of the present invention.

By way of summary, FIG. 3 illustrates an overview of one embodiment of a process for facilitating fabricating a fin-type transistor 300, in accordance with one or more aspects of the present invention. In the embodiment illustrated, the process includes, for example: providing a gate structure extending at least partially over a fin extending above a substrate 310; using isotropic etching and anisotropic etching to form an extended cavity within the fin, where the extended cavity in part undercuts the gate structure, and where the using of the isotropic etching and the anisotropic etching deepens the extended cavity into the fin below the undercut gate structure 320; and forming an embedded stress element at least partially within the extended cavity, including below the gate structure 330.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising a fin-type transistor, the fin-type transistor comprising:
   a gate structure extending at least partially over a fin extending above a substrate;
   an extended cavity within the fin, wherein the extended cavity in part undercuts the gate structure, and extends into the fin below the undercut gate structure, wherein the fin comprises a {110} plane extending downward below the gate structure; and
   an embedded stress element disposed at least partially within the extended cavity, including below the gate structure, the embedded stress element comprising one of a drain or a source of the fin-type transistor.

2. The structure of claim 1, wherein the fin comprises an active layer above an isolation layer, and wherein the embedded stress element where undercutting the gate structure extends into the fin for a majority of a thickness of the active layer.

3. The structure of claim 1, wherein the fin comprises a {111} plane extending at an angle laterally below the gate structure.

4. The structure of claim 1, wherein the fin comprises:
   a first tip, the first tip being an intersection of the {110} plane and a first {111} plane of the fin; and
   a second tip, the second tip being an intersection of the {110} plane and a second {111} plane of the fin, wherein the second tip is below the first tip.

5. The structure of claim 1, wherein the extended cavity is a first extended cavity in part undercutting a first side of the gate structure and the embedded stress element is a first embedded stress element, and wherein the structure further comprises:
   a second extended cavity within the fin, the second extended cavity in part undercutting a second side of the gate structure, the first side and the second side being opposite sides of the gate structure, and wherein the second cavity extends into the fin below the undercut second side of the gate structure;
   a second embedded stress element disposed at least partially within the second extended cavity, including below the gate structure, the second embedded stress element comprising a source or drain of the fin-type transistor; and
   a channel region of the fin-type transistor, wherein the channel region comprises a region of the fin located between the first extended cavity and the second extended cavity.

6. A method comprising:
   facilitating fabricating a fin-type transistor, the facilitating fabricating comprising:
      providing a gate structure extending at least partially over a fin extending above a substrate;
      using isotropic etching and anisotropic etching to form an extended cavity within the fin, wherein the extended cavity in part undercuts the gate structure, wherein the using of the isotropic etching and the anisotropic etching deepens the extended cavity into the fin below the undercut gate structure, and wherein the anisotropic etching comprises etching along a {110} plane extending downward into the fin below the gate structure to facilitate defining a portion of the extended cavity; and
      forming an embedded stress element at least partially within the extended cavity, including below the gate structure.

7. The method of claim 6, wherein the fin comprises an active layer above an isolation layer, and wherein the extended cavity, where undercutting the gate structure, extends into the fin for a majority of a thickness of the active layer.

8. The method of claim 6, wherein the isotropic etching comprises etching along a {111} plane extending at an angle laterally into the fin below the gate structure to facilitate defining a portion of the extended cavity.

9. The method of claim 6, wherein forming an embedded stress element comprises epitaxially growing a material from at least one surface of the fin within the extended cavity to form the embedded stress element, the embedded stress element applying a stress on a portion of the fin below the gate structure.

10. The method of claim 6, wherein the embedded stress element comprises one of a drain or a source of the fin-type transistor.

11. The method of claim 6, wherein the gate structure is a first gate structure, and the extended cavity is a first extended cavity in part undercutting the first gate structure, and wherein the method further comprises providing a second gate structure extending at least partially over the fin, the using of the isotropic etching and the anisotropic etching further comprising forming a second extended cavity within the fin, wherein the second extended cavity in part undercuts the second gate structure, and wherein the using of the isotropic and the anisotropic etching deepens the second extended cavity into the fin below the undercut second gate structure.

12. The method of claim 1, wherein the gate structure comprises a spacer layer, and the undercutting comprises undercutting the spacer layer.

13. The method of claim 12, wherein a thickness of the spacer layer of the gate structure laterally limits the extended cavity below the gate structure by blocking a portion of the isotropic etching from reaching below the gate structure.

14. The method of claim 6, wherein the extended cavity is a first extended cavity in part undercutting a first side of the gate structure and the embedded stress element is a first embedded stress element, and wherein the using isotropic etching and anisotropic etching further comprises forming a second extended cavity within the fin, the second extended cavity in part undercutting a second side of the gate structure, wherein using the isotropic etching and the anisotropic etching deepens the second extended cavity into the fin below the undercut second side of the gate structure, and wherein the method further comprises forming a second embedded stress element at least partially within the second extended cavity, including below the gate structure.

15. The method of claim 14, wherein a region of the fin between the first extended cavity and the second extended cavity comprises a channel of the fin-type transistor, the first embedded stress element comprises a source of the fin-type transistor, and the second embedded stress element comprises a drain of the fin-type transistor.

16. The method of claim 6, wherein the using the isotropic etching and the anisotropic etching comprises sequentially using the isotropic etching and the anisotropic etching.

17. The method of claim 16, wherein the sequentially using the isotropic etching and the anisotropic etching comprises:
   isotropically etching an exposed upper surface of the fin to form an initial cavity at least partially undercutting the gate structure; and
   anisotropically etching an exposed surface of the fin within the initial cavity to extend the initial cavity further downward into the fin by, in part, further removing material below the gate structure, thereby forming the extended cavity.

18. The method of claim 16, wherein the sequentially using the isotropic etching and the anisotropic etching comprises:
   anisotropically etching an exposed upper surface of the fin to form an initial cavity extending downward into the fin; and
   isotropically etching an exposed surface of the fin within the initial cavity to, in part, remove material below the gate structure and undercut the gate structure, thereby forming the extended cavity below the undercut gate structure.

* * * * *

UNITED STATES PATENT AND TRADEMARK OFFICE
CERTIFICATE OF CORRECTION

PATENT NO.        : 9,024,368 B1
APPLICATION NO.   : 14/079757
DATED             : May 5, 2015
INVENTOR(S)       : Yu et al.

Page 1 of 1

It is certified that error appears in the above-identified patent and that said Letters Patent is hereby corrected as shown below:

In the Claims

Column 13, Line 22: Claim 12, Delete "claim 1" and insert -- claim 6 --

Signed and Sealed this
Eighth Day of September, 2015

Michelle K. Lee
*Director of the United States Patent and Trademark Office*